(12) United States Patent
Ishihara

(10) Patent No.: US 9,175,377 B2
(45) Date of Patent: Nov. 3, 2015

(54) FILM FORMING APPARATUS AND FILM FORMING METHOD

(75) Inventor: Shigenori Ishihara, Yokohama (JP)

(73) Assignee: Canon Anelva Corporation, Kawasaki-shi (JP)

( * ) Notice: Subject to any disclaimer, the term of this patent is extended or adjusted under 35 U.S.C. 154(b) by 891 days.

(21) Appl. No.: 13/197,843

(22) Filed: Aug. 4, 2011

(65) Prior Publication Data

US 2012/0031748 A1 Feb. 9, 2012

(30) Foreign Application Priority Data

Aug. 6, 2010 (JP) .................................. 2010-176884
Jun. 29, 2011 (JP) .................................. 2011-143926

(51) Int. Cl.
C23C 14/35 (2006.01)
C23C 14/00 (2006.01)
C23C 14/06 (2006.01)

(52) U.S. Cl.
CPC ......... *C23C 14/0042* (2013.01); *C23C 14/0063* (2013.01); *C23C 14/0068* (2013.01); *C23C 14/0641* (2013.01); *C23C 14/35* (2013.01)

(58) Field of Classification Search
CPC ............ C23C 14/0068; C23C 14/0042; C23C 14/0063; C23C 14/00641; H01J 37/3485; H01J 37/3476; H01J 37/3347; H01J 37/3244; H01J 37/32449
USPC ............................ 204/298.11, 298.03, 298.07
See application file for complete search history.

(56) References Cited

U.S. PATENT DOCUMENTS 4,428,811 A * 1/1984 Sproul et al. ............. 204/192.13
5,026,471 A * 6/1991 Latz et al. ................ 204/298.19
(Continued)

FOREIGN PATENT DOCUMENTS

JP 04-136165 * 5/1992
JP 4-350929 A 12/1992
(Continued)

OTHER PUBLICATIONS

Office Action in JP Application No. 2011-143926 dated Sep. 26, 2014 (4 pages including translation).

*Primary Examiner* — Rodney McDonald
(74) *Attorney, Agent, or Firm* — Fitzpatrick, Cella, Harper & Scinto

(57) ABSTRACT

The present invention provides a film forming apparatus and a film forming method which are unlikely to be affected by changes in size and shape of a shield board caused by a recovery process. A film forming apparatus includes a shield board surrounding a sputtering space between a process-target substrate on a stage and a target facing each other in a vacuum chamber, and forms a film on the process-target substrate by causing at least one kind of reactive gas and a film forming material to react with each other. The film forming apparatus is configured to control a ratio of the flow rate of the gas to be introduced into the sputtering space to the flow rate of the gas to be introduced into a space between an inner wall of the vacuum chamber and the shield board, based on a pressure value of the sputtering space measured by pressure detection means.

17 Claims, 12 Drawing Sheets

(56) References Cited

U.S. PATENT DOCUMENTS

| | | | |
|---|---|---|---|
| 5,108,569 A * | 4/1992 | Gilboa et al. | 204/192.13 |
| 5,169,509 A * | 12/1992 | Latz et al. | 204/298.03 |
| 5,267,607 A | 12/1993 | Wada | |
| 5,322,568 A | 6/1994 | Ishihara et al. | |
| 5,470,451 A | 11/1995 | Kobayashi et al. | |
| 5,827,408 A | 10/1998 | Raaijmakers | |
| 6,645,357 B2 * | 11/2003 | Powell | 204/298.11 |
| 7,001,491 B2 * | 2/2006 | Lombardi et al. | 204/192.12 |
| 8,992,743 B2 | 3/2015 | Yamaguchi et al. | |

FOREIGN PATENT DOCUMENTS

| | | |
|---|---|---|
| JP | 05-247639 A | 9/1993 |
| JP | 7-310178 A | 11/1995 |
| JP | 9-428 U | 8/1997 |
| JP | 10-64850 A | 3/1998 |
| JP | 2009-200405 A | 2/2008 |
| WO | 2011-077653 A1 | 6/2011 |

* cited by examiner

FILM FORMING APPARATUS AND FILM FORMING METHOD

CROSS-REFERENCE TO RELATED APPLICATIONS

This application claims the benefit of Japanese Patent Application No. 2010-176884, filed Aug. 6, 2010 and Japanese Patent Application No. 2011-143926, filed Jun. 29, 2011. The contents of the aforementioned applications are incorporated herein by reference in their entirety.

BACKGROUND OF THE INVENTION

1. Field of the Invention

The present invention relates to a film forming apparatus and a film forming method for performing a film forming process on a substrate in a reduced-pressure environment using a vacuum pump and a vacuum chamber, and especially relates to a physical vapor deposition apparatus and a physical vapor deposition method for forming a film by causing a film forming material emitted from a target to react with a reactive gas by use of a shield board included in a vacuum chamber.

2. Description of the Related Art

In recent years, there has been a tendency to apply a sputtering technique to metallic compounds such as titanium nitride and the like to be used for electrodes of a ferroelectric capacitor of a nonvolatile semiconductor memory circuit (Fe-RAM: Ferroelectric Random Access Memory) using, for example, a ferroelectric material, since the sputtering technique can achieve high purity and excellent control of film thickness. In the application of the sputtering technique, a so-called "reactive sputtering" technique is often used in which desired metallic compounds are obtained by sputtering a target of a simple metallic substance with an inert gas such as argon and then causing emitted metallic particles to react with a reactive gas such as nitrogen or oxygen. In this technique, a reactive gas, e.g. oxygen or nitrogen, is introduced into a vacuum chamber together with a sputtering gas (e.g. argon), molecules of the reactive gas and metallic particles emitted from the target through the sputtering are caused to react with each other, and thereby a thin film of generated reaction compounds is formed on a substrate.

FIG. 14 is a schematic diagram showing a conventional reactive sputtering apparatus. Such an apparatus is disclosed in Japanese Patent Application Publication No. 2009-200405, and is capable of depositing metallic compounds such as titanium nitride (TiN), iridium oxide (IrOx) or the like through reactive sputtering.

This apparatus includes exhaust means (not shown) such as an unillustrated turbo-molecular pump or the like connected to a vacuum chamber 301 formed of stainless or the like, and the vacuum chamber 301 is capable of maintaining a high-vacuum environment with a pressure of $1 \times 10^{-8}$ Pa, for example. Moreover, the vacuum chamber 301 includes a stage 302 for holding a process-target substrate 303, and a film forming process is performed on the process-target substrate 303 placed on the stage 302.

A target 305 is formed of a pure substance or compounds of a film forming material. An unillustrated DC power supply is connected to the target 305 so that a voltage can be applied to the target 305. The target 305 is disposed in isolation from the vacuum chamber 301. Further, an unillustrated magnet is provided so that a magnetic filed can be applied to a surface of the target 305. Here, the target 305 is disposed on a packing plate 304.

Gas introduction means 314 and 315 each include flow control means such for example as a mass-flow controller, and a valve and the like. In the gas introduction means 314 and 315, means 314 for supplying a reactive gas such as nitrogen and means 315 for supplying a sputtering gas such as argon, for example, are connected together, and are configured to introduce the reactive gas and the sputtering gas into the vacuum chamber 301. The gas introduction means 315 introduces the sputtering gas, and the gas introduction means 314 introduces the reactive gas such as nitrogen. When the DC power supply inputs power to apply a negative voltage to the target 305, magnetron discharge is caused with the magnet.

Through the magnetron discharge, the sputtering gas is turned into a plasma near the target 305, and the positive ions of the plasma are accelerated by the target 305 having the negative voltage and thereby collide with the target 305. This collision of the positive ions causes atoms, molecules and the like to be emitted from the target 305, and the emitted atoms react with the reactive gas simultaneously introduced by the gas introduction means 314 to generate metallic compounds. The metallic compounds thus generated reach a surface of the substrate 303 facing the target 305. In this way, a desired film is formed on the substrate 303.

For example, by using iridium for the target 305 and an oxygen ($O_2$) gas as the reactive gas 314, an iridium oxide (IrOx) film, which is a ferroelectric substance, is formed on the substrate 303. An $O_2$ gas concentration meter 311 for measuring the concentration of $O_2$ of the $O_2$ gas is connected to the vacuum chamber 301 thorough a pipe 312. The data on the $O_2$ concentration of the $O_2$ gas measured by the $O_2$ gas concentration meter 311 is transmitted to a control unit 313 electrically connected with the $O_2$ gas concentration meter 311.

In the above-described apparatus, sputtered film is scattered around and deposited on the entire area of the vacuum chamber 301 as well as the substrate. In order to prevent particles from occurring in the film forming step, a shield board 306 needs to be provided to trap the scattered film and avoid the film from coming off easily. The shield board 306 is processed by blasting or the like so as to have a rougher surface than that of a base material, and is configured to avoid the film attached to the shield board 306 from easily coming off from the shield board 306. Further, the shield board 306 is configured to be reusable in a way that when a certain amount of film is deposited on the shield board 306, the shield board 306 is detached and then separately processed by blasting or the like to remove the deposited film. Moreover, the shield board 306 is configured to form a shield-inside space 318 and a shield-outside space 319 by surrounding a space from near the target 305 to the stage 302. The shield-inside space 318 and the shield-outside space 319 encircle the target in the film forming chamber 301. The shield board 306 prevents the film from attaching to wall surfaces of the shield-outside space 319.

Here, the reactive gas and the sputtering gas introduced into the shield-outside space 319 by the gas introduction means 314 and 315 are supplied to the shield-inside space 318 through an opening 320 in the shield board 306 while being discharged from the shield-inside space 318 to the shield-outside space 319 at the same time.

Since the concentration of the reactive gas 315 significantly affects the film quality, the means 311 for monitoring the concentration of the reactive gas is provided near the process-target substrate 303 in the shield-inside space 318 as described above. It is described that quality control of the film is achieved at a low cost by controlling the flow rate of the reactive gas supplied to the gas introduction means 314 so that the concentration of the reactive gas would be kept constant near the process-target substrate.

Meanwhile, FIG. 15 is a schematic diagram showing another conventional reactive sputtering apparatus. Such an apparatus is disclosed in Japanese Patent Application Publication No. Hei 05-247639. This apparatus includes a shield board 406 defining a sputtering space in a vacuum chamber 401, and is configured to form a thin film on a surface of a wafer 408 placed on a wafer stage 407 in the vacuum chamber 401, by depositing metallic particles emitted from a sputtering target 405 disposed in an upper part of the vacuum chamber 401. Further, this apparatus includes a reactive gas introduction port 403a configured to introduce a reactive gas such as argon directly into the space defined by the shield board (shield) 406, and a manometer 404 capable of directly measuring the pressure in the space defined by the shield board 406. In FIG. 15, 401a denotes a discharge port, 401b denotes a wafer receiving port, 402a denotes a gate valve, 402 denotes a cryopump, and 406a denotes an opening in the shield board 406. In the case of this apparatus, a reactive-gas discharge port 410 is formed in the shield board 406, and is configured to exhaust the reactive gas directly into a shield-inside space 418. It is possible to adjust the flow rate of the reactive gas being introduced, while monitoring the pressure in the shield-inside space 418 by use of the manometer 404 for measuring the pressure.

However, in each of the above-described two apparatuses, the shield board 306 or 406 needs a replacement process on a regular basis in order to remove a film attached to the surface of the shield board 306 or 406. In the replacement process, the shield board 306 or 406 is detached from the gas introduction means 314 and 315 or 403a at a connection part. In general, to enable reuse of the shield board 306 or 406 for a certain number of times, a recovery process is performed in which an attaching film is removed by a chemical or physical force after the shield board is removed. In this recovery process, it is difficult to remove only the attached film without applying any stress to the shield board 306 or 406 at all, and the shield board 306 or 406 itself is inevitably changed in shape and size through chemical etching or a physical removing process.

Moreover, even if no recovery process is involved, the shield board 306 or 406 is detached and then attached again for the purpose of replacing a used-up target or the like. This operation may cause a change in attachment position of the shield board 306 or 406 or in clearance between the target 305 or 405 and the shield board 306 or 406. It is also natural that the attachment position of the shield board 306 or 406 varies between different chambers configured of the same components.

In the case of such a reactive sputtering apparatus as disclosed in Japanese Patent Application Publication No. 2009-200405, a change in shape or attachment position of the shield board 306 also causes a change in size of the opening 320 between the shield-inside space 318 and the shield-outside space 319. This may cause a change in flow rate of the reactive gas supplied to the shield-inside space 318 and the shield-outside space 319. In order to make calibration for this, the flow rate itself of the reactive gas 314 may be adjusted so that the concentration of the reactive gas in the shield-inside space 318 can be at a predetermined value. However, this also changes the flow rate of the reactive gas introduced into the shield-outside space 319, and consequently may affect the distribution of the reactive gas in the shield-inside space 318. In other words, a change in pressure in the shield-outside space 319 changes the rate and the distribution of the flow of the reactive gas from the shield-inside space 318 to the shield-outside space 319, which may consequently affect the film quality and the distribution obtained through the reactive sputtering.

By contrast, such a reactive sputtering apparatus as disclosed in Japanese Patent Application Publication No. Hei 05-247639 is configured to let the introduced reactive gas from the introduction means 403a directly into the shield-inside space 418. Here, in order to introduce the whole amount of the reactive gas introduced by the gas introduction means 403a into the shield-inside space 418, the gas inlet part 410 needs to be airtight from the shield-outside space 419.

However, an apparatus such as a reactive sputtering apparatus is likely to be negatively affected by an out gas from a member. Accordingly, for a supply path of the reactive gas, using a resin sealing material or the like is not preferable, and using a technique such as welding or solder bonding significantly reduces efficiency in detaching the shield board 406. In addition, since changes in shape and size as a result of recovering the shield board 406 occur randomly, it is difficult to control the amount of the reactive gas leaking from the gas inlet part 410 to the shield-outside space 419. Hence, this apparatus has a similar problem as that of Japanese Patent Application Publication No. 2009-200405 in terms of reproducibility of the film quality of the reactive sputtering in association with the recovery of the shield board 406. No technique which can solve this problem is known so far as long as the inventors of the present invention know.

SUMMARY OF THE INVENTION

The present invention has been made in view of the above-described problems, and aims to provide a film forming apparatus and a film forming method which is less likely to be affected by changes in size and shape caused by a recovery process for a shield board, and a calibration method for the film forming apparatus.

To achieve the above-described object, an aspect of the present invention provides a film forming apparatus for forming a film on a process-target substrate by causing at least one kind of reactive gas and a film forming material to react with each other in a vacuum chamber, the film forming apparatus comprising: a shield board surrounding a sputtering space between the process-target substrate and a target facing each other in the vacuum chamber, the target containing the film forming material; gas supply means for supplying a gas containing at least the reactive gas to the vacuum chamber in forming the film, the gas supply means including first gas introduction means for introducing the gas into the sputtering space surrounded by the shield board and second gas introduction means for introducing the gas into a sputtering outside space between an inner wall of the vacuum chamber and the shield board, the second gas introduction means branching off from the first gas introduction means; and gas flow ratio control means for adjusting a ratio of a flow rate of the gas to be introduced into the sputtering space by the first gas introduction means to a flow rate of the gas to be introduced into the sputtering outside space by the second gas introduction means.

Another aspect of the present invention provides a calibration method for a film forming apparatus for forming a film on a process-target substrate by causing at least one kind of reactive gas and a film forming material to react with each other, the film forming apparatus including a shield board surrounding a sputtering space between the process-target substrate and a target facing each other in a vacuum chamber, and gas supply means including first gas introduction means for introducing a gas into the sputtering space surrounded by the shield board and second gas introduction means for introducing a gas into a sputtering outside space between an inner wall of the vacuum chamber and the shield board, the second gas introduction means branching off from the first gas introduction means, the calibration method comprising: a first step of supplying a measurement gas of a predetermined flow rate from the gas supply means to the vacuum chamber; a second step of detecting a signal value indicating a pressure in the sputtering space; and a third step of adjusting a ratio of the flow rate of the measurement gas to be introduced into the sputtering space by the first gas introduction means to the flow rate of the measurement gas to be introduced into the sputtering outside space by the second gas introduction means, to make the signal value equal to a predetermined calibration reference value.

According to the present invention, the ratio of the flow rate of the gas to be introduced into the sputtering space to the flow rate of the gas to be introduced into the space between the inner wall of the vacuum chamber and the shield board is controlled on the basis of the signal indicating the pressure in the sputtering space measured by the pressure measurement means. Accordingly, even if the flow rate of the reactive gas leaking outside the sputtering space varies in introducing the reactive gas into the sputtering space, due to changes in shape and size of the shield board along with recovery of the shield board or variations in attachment position along with detachment and attachment of the shield board, the present invention can provide effects that variations in flow rate of the reactive gas introduced into both the inside and the outside the shield can be reduced and that the reproducibility of the film quality can be maintained.

DETAILED DESCRIPTION OF THE INVENTION

Figure 1:
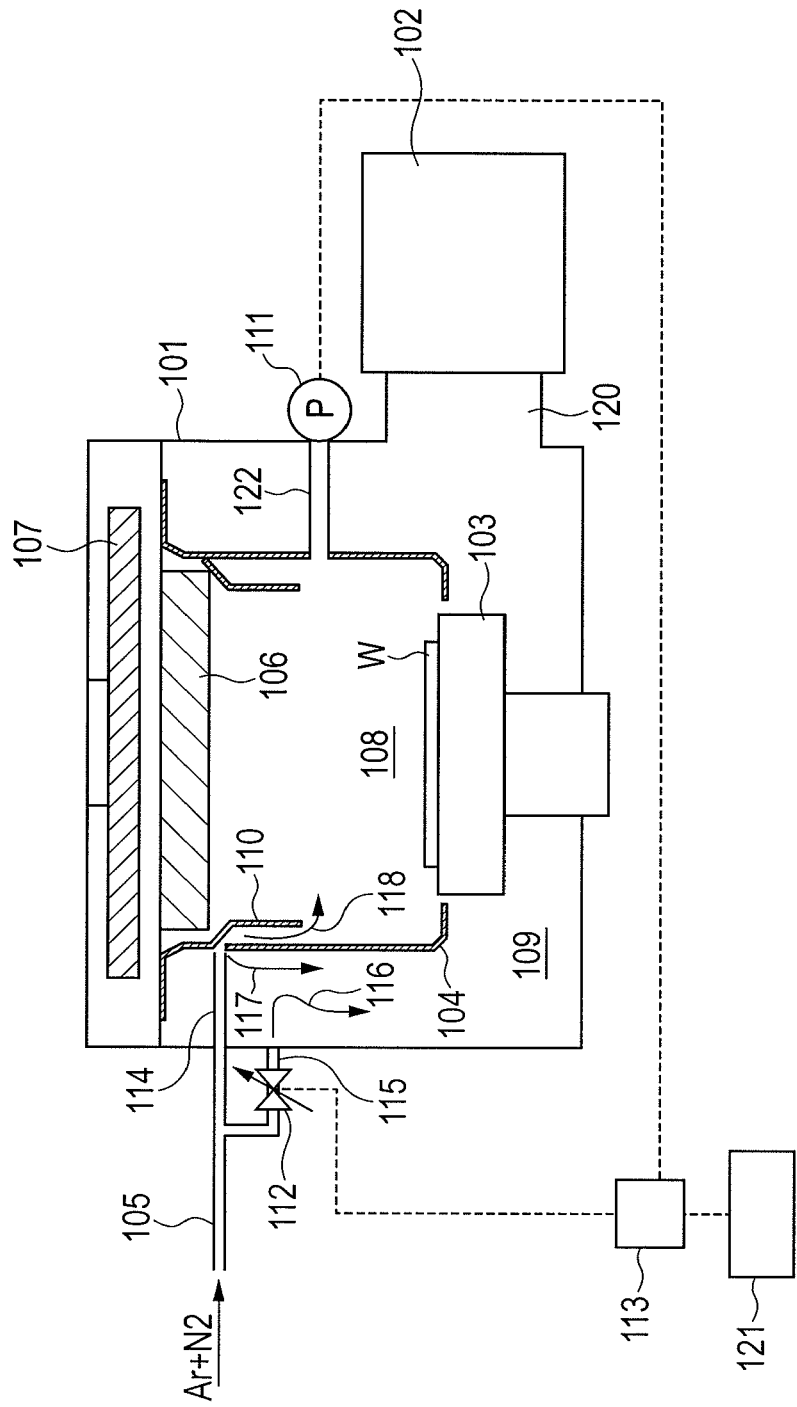
FIG. 1 is a schematic view showing a configuration of a reactive magnetron sputtering apparatus according to an embodiment of the present invention.
Figure 2:
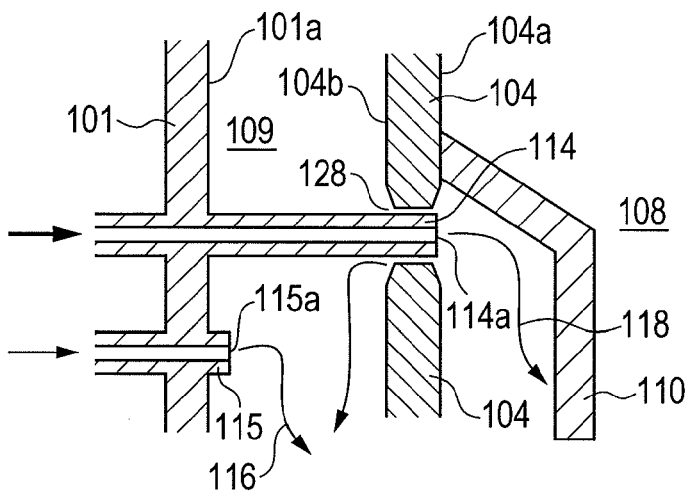
FIG. 2 is an enlarged view of a gas introduction part of the reactive magnetron sputtering apparatus according to the embodiment of the present invention.

FIG. 1 and FIG. 2 are schematic diagrams of a reactive sputtering apparatus used to manufacture a semiconductor device, according to an example of an embodiment of the present invention. The physical vapor deposition apparatus (reactive sputtering apparatus) in FIG. 1 for forming a film on a process-target substrate by causing at least one kind of reactive gas to react with a film forming material includes: a shield board 104 surrounding a sputtering space (also referred to as a "shield-inside space") between a process-target substrate W on a stage 103 and a target 106 facing each other in a vacuum chamber 101; gas supply means (also referred to as "first gas supply means") 105 for supplying a gas to the vacuum chamber 101; and a manometer (also referred to as a "pressure sensor") 111 for measuring a pressure in the sputtering space 108.

A first feature of the apparatus according to the embodiment of the present invention is that the gas supply means 105 is configured of first gas introduction means and second gas introduction means branching off each other. A second feature of the apparatus according to the embodiment of the present invention is that a first gas introduction pipe 114 for introducing a gas into the sputtering space 108 is included as the first gas introduction means, one end of the first gas introduction pipe 114 being connected to an opening 128 of the shield board 104 provided in the vacuum chamber 101, and that a second gas introduction pipe 115 for introducing a gas into a space between an inner wall 101a of the vacuum chamber 101 and an outer wall 104b of the shield board 104 is included as the second gas introduction means. A third feature of the apparatus according to the embodiment of the present invention is that the gas supply means 105 includes a variable valve 112, a controller 113 and a storage 121 as gas flow ratio control means for controlling the ratio of the flow rate of a gas introduced into the first gas introduction pipe 114 to the flow rate of a gas introduced into the second gas introduction pipe 115, on the basis of a pressure value of the sputtering space 108 measured by the manometer 111. A fourth feature of the apparatus according to the embodiment of the present invention is to include: a first step of supplying the at least one kind of reactive gas to the vacuum chamber 101; a second step of measuring the pressure in the sputtering space 108; and a third step of controlling the ratio of the flow rate of the reactive gas introduced into the sputtering space 108 to the flow rate of the reactive gas introduced into a sputtering outside space between the inner wall 101a of the vacuum chamber 101 and the shield board 104.

The apparatus of this embodiment uses titanium (Ti) for the target 106, and can deposit titanium nitride (TiN) on the process-target substrate W by causing DC magnetron discharge using Argon (Ar) for a sputtering gas and nitrogen ($N_2$) for a reactive gas and thereby performing sputtering on the target. The vacuum chamber 101 is formed of a metallic material such as stainless to have an airtight structure. Moreover, an exhaust port 120 is formed in a wall of the vacuum chamber 101, and a turbo-molecular pump 102 as exhaust means is connected to the exhaust port 120. This turbo-molecular pump 102 can create a high vacuum of $1\times10^{-8}$ Pa in the vacuum chamber 101.

The gas supply means 105 is connected with a chemical cylinder and a mass-flow controller, which are not shown, and is configured to be capable of supplying a mixture of Ar and $N_2$ each controlled to have a desired flow.

Further, the gas supply means 105 includes branching so as to be connected to the first gas introduction pipe 114 and the second gas introduction pipe 115 and thereby supply a mixture of Ar and $N_2$ to the vacuum chamber 101.

The target 106 is made of Ti, and is connected with an unillustrated DC power supply while being held by an unillustrated target holding mechanism. Further, the target 106 is insulated from the wall surface of the vacuum chamber 101, and a desired negative voltage can be applied to the target 106. A magnet 107 is disposed so as to be capable of applying a magnetic field to near a target surface.

The mixed gas is introduced by the gas introduction pipes 114 and 115 into the vacuum chamber 101 which is vacuumed by the exhaust means 102, and then a negative voltage is applied to the surface of the target 106 to cause magnetron discharge. Thereby, sputtering is performed on the surface of the target 106. Titanium particles emitted through the sputtering react with the introduced $N_2$, forming TiN on the process-target W placed on the stage 103.

However, Ti and TiN diffused in the vacuum chamber 101 scatter around and are deposited on not only the process-target substrate W but also the entire area of the vacuum chamber 101. This leads to a concern that, when deposited Ti and TiN reach a certain amount, they may come off and become a particle source. As measures to prevent Ti and TiN from depositing on unreplaceable members, the shield board 104, which is made of an aluminum alloy or the like and is replaceable, is provided so as to surround the film forming space including the target 106 and the process-target substrate W. The shield board 104 thus configured divides the vacuum chamber 101 into the sputtering space 108 surrounded by the shield board (also referred to as a "shield") 104 and a sputtering outside space (also referred to as a "shield-outside space") 109. Thus, the sputtering space 108 is a shield-inside space surrounded by the target 106, the process-target substrate W and the shield board 104.

The first gas introduction pipe 114 is configured to supply the mixed gas to the sputtering space 108. Specifically, the first gas introduction pipe 114 is inserted into the opening 128 formed in the shield board 104 as shown in FIG. 2.

Here, as described above, the shield board 104 needs to be replaced if a certain amount of film is deposited thereon, and is hence required being easily detachable. In addition, the shield board 104 is reused a certain number of times by being detached and then processed for removal of the deposited film by chemical means such as wet etching or physical means such as blasting (referred to as a "recovery process" below). Hence, a change in size and distortion in shape may occur to some extent.

For these reasons, it is desirable that the opening 128 have a structure with some level of clearance from the first gas introduction pipe 114. For example, the opening 128 may be formed to have a diameter of approximately 10 mm if the first gas introduction pipe 114 has an external diameter of 6.4 mm.

Further, if film attaches to an inlet port 114a of the first gas introduction pipe 114, which is not a replaceable member, it may be a particle source. As measures against this, a second shield board 110 is provided between the inlet port 114a and the target 107. As shown in FIG. 2, the second shield board 110 is attached to surround the inlet port 114a of the first gas introduction pipe 114. This brings about an effect of preventing the particle source from being exhausted to the sputtering space 108 if film attaches to the inlet port 114a.

Meanwhile, an inlet port 115a of the second gas introduction pipe 115 is configured to introduce the mixed gas into the shield-outside space 109. Moreover, the second gas introduction pipe 115 is provided with the variable valve 112 as the gas flow ratio control means, such as a variable conductance valve. By operating this valve, appropriate changes can be made in the ratio of the flow rate of the gas introduced into the shield-inside space 108 from the inlet port 114a of the first gas introduction pipe 114 to the flow rate of the gas introduced into the shield-outside space 109 from the inlet port 115a of the second gas introduction pipe 115. Further, the pressure in the shield-inside space 108 can be measured by the pressure sensor 111, using a capacitance manometer, for example, connected to the shield board 104 through a pipe 122, for example.

Here, not the whole amount of the gas introduced from the inlet port 114a of the first gas introduction pipe 114 is discharged to the shield-inside space 108 (an arrow 118 in FIG. 2), because part of the gas leaks to the shield-outside space 109 through a connection part of the first gas introduction pipe 114 and the shield board 104 (an arrow 117 in FIG. 2). In addition, a change in size and distortion may occur in the shield board 104 due to the recovery process, and hence it is difficult to keep constant the flow rate of each of the gas leaking to the shield-outside space 109 and the gas introduced into the shield-inside space 108.

To address this issue, calibration is performed by introducing a predetermined flow rate of a measurement gas into the gas supply means 105 and adjusting the value of the pressure sensor 111 to be within a predetermined range by the variable valve 112. Here, as means for adjusting the ratio of the flows of the gas to be introduced into the gas introduction pipes 114 and 115 branching off each other, a valve, a variable orifice or the like may be provided to each of the pipes 114 and 115 to independently adjust the conductances of the pipes 114 and 115, or conductance adjustment means may be provided only to one of the pipes 114 and 115. It is, however, preferable to provide adjustment means only to one of the pipes 114 and 115 in order to provide the apparatus at a low cost. Here, the measurement gas may be argon (Ar), which is a sputtering gas, nitrogen ($N_2$), which is a reactive gas, or any other gas.

Thus, the flow rate of the gas introduced from each of the inlet ports 114a and 115a is adjusted to be constant. This adjustment enables adjustment of the total value (116+117) of the flows of the gases introduced into the shield-outside space 109, consequently canceling out variations in the flow rate of the gas 117 leaking to the shield-outside space 109 from the inlet port 114a and the flow rate of the gas 118 introduced into the shield-inside space 108. Hence, it is possible to control the pressures of both the inside and outside of the shield-inside space 108 with excellent reproducibility, and to maintain the reproducibility of film quality even in reactive sputtering, which is sensitive to the partial pressure of the reactive gas and the distribution of the reactive gas in the shield-inside space 108.

An investigation into an impact on TiN-film forming performance of this apparatus was performed while repeatedly performing the recovery process on the shield board 104 by blasting. Specifically, TiN-film forming with the shield board 104 disposed in the apparatus and recovery of the shield board 104 by detaching the shield board 104 were repeatedly performed. Conditions for the TiN-film forming are as follows: DC power of 900 W, Ar flow rate of 40 sccm (standard cubic centimeter per minute), $N_2$ flow rate of 20 sccm, film forming time of 500 seconds. Under these conditions, film forming was performed on a silicon wafer on which $SiO_2$ is formed, and a value of the sheet resistance of TiN was measured. Here, sccm=a value in $cm^3$ indicating the flow rate of a gas supplied per minute at 0° C. at 1 atmospheric pressure=$1.69\times10^{-3}$ $Pa\cdot m^3/s$ (at 0° C.).

Figure 3:
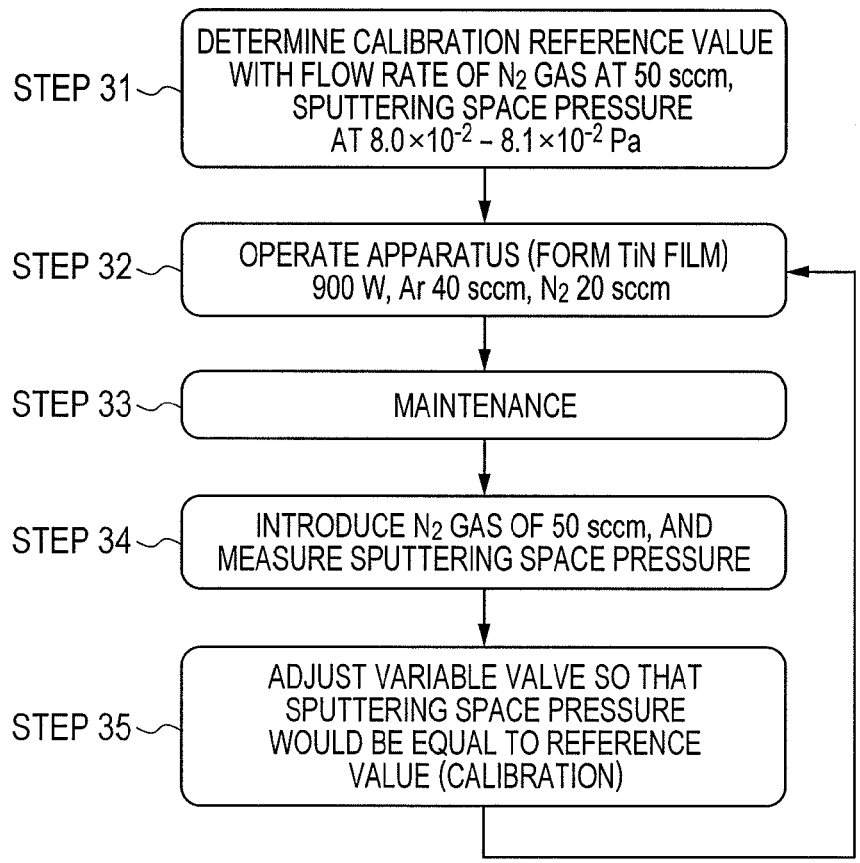
FIG. 3 is a flowchart showing a method of calibrating the reactive magnetron sputtering apparatus according to the embodiment of the present invention.

A specific procedure for performing calibration by adjusting the variable valve 112 is shown in FIG. 3 using a flowchart. Performing calibration reduces variations in film-forming conditions occurring before and after a maintenance process, and thereby makes it possible to maintain the reproducibility of film quality. Here, a maintenance process indicates a process which may cause changes in shape and attachment position of the shield board and consequently changes in the flows of the reactive gas in both the inside and outside of the shield-inside space 108. Such processes are the recovery process of the shield board and replacement of the shield board, for example.

In the procedure shown in FIG. 3, a signal value to serve as a reference value is acquired before the maintenance process for the vacuum chamber 101 to be calibrated, and calibration is performed after the maintenance process.

Firstly, a pressure value to serve as the reference value in the calibration is determined. In the case of the apparatus of this embodiment, when the variable valve 112 is set at an intermediate position to start with and an $N_2$ gas of 50 sccm is supplied by the gas supply means 105, the value of the pressure sensor 111 is $8.05\times10^{-2}$ Pa. Accordingly, the distribution ratio of the reactive gas inside and outside the shield-inside space 108 of this apparatus is adjusted so that the pressure value of the shield-inside space 108 would be within a calibration reference value from $8.0\times10^{-2}$ Pa to $8.1\times10^{-2}$ Pa when the $N_2$ gas of 50 sccm is introduced in total (Step 31).

Then, a TiN film is formed in the vacuum chamber 101 for which the calibration reference value is determined in Step 31 (Step 32). Thereafter, the vacuum chamber 101 is opened to perform the recovery process on the shield board 104 provided therein, and then the recovered shield board 104 is placed in the same vacuum chamber 101 again (Step 33). Then, the vacuum chamber 101 is vacuumed, and an $N_2$ gas of 50 sccm is supplied to the vacuum chamber 101 by the gas supply means 105 (Step 34). Calibration is performed by adjusting the variable valve 112 so that the value of the pressure sensor 111 in this state would be within the calibration reference value (Step 35). Through this process, the reactive gas introduced by the gas supply means is adjusted to be distributed to the shield-inside space 108 and the shield-outside space 109 at the same ratio as that in Step 31. By performing calibration after the maintenance process for the apparatus, which may affect the gas distribution ratio, such as the recovery process and replacement of the shield 104, as described above, the reactive gas can be distributed to the inside and outside of the shield-inside space 108 at the same ratio as that at the time of the calibration. This prevents variations in the reactive sputtering conditions.

The vacuum chamber in which the signal value to serve as the calibration reference value is acquired (referred to as a "reference chamber" below) and the vacuum chamber in which calibration is performed after the maintenance process (referred to as an "adjustment chamber" below) may be the same vacuum chamber before the maintenance process and after the maintenance process, or may be different vacuum chambers having the same configuration. Moreover, the usage of the target placed in each of the vacuum chambers, i.e. an accumulated value of power applied in each chamber (referred to as an "accumulated power" below), may be different.

Determination of a reference value for calibration needs not be performed first. A signal value to serve as the reference value may be measured during film forming, or may be measured immediately before the maintenance process, instead.

If film forming is performed more than once after single calibration, calibration need not be performed until after the next maintenance process, or may be performed every time film forming is performed for the predetermined number of times.

To estimate the effect of this embodiment according to the present invention in performing the calibration shown in FIG. 3, a comparison of change in TiN-film quality between a case of not performing any adjustment with the variable valve 112 fixed in a totally-closed state and a case of performing calibration by adjusting the variable valve 112 immediately after replacement of the shield.

Table 1 below shows the results of the experiment performed on the apparatus according to this embodiment of the present invention shown in FIG. 1.

TABLE 1

| | | Number of times of shield board recovery | | | | |
|---|---|---|---|---|---|---|
| | | 0 | 1 | 2 | 3 | 4 |
| Valve 112 totally closed (no adjustment) | Pressure in shield-inside space (Pa) when $N_2$ of 50 sccm is introduced to 105 | $1.1 \times 10^{-1}$ | $1.1 \times 10^{-1}$ | $9.5 \times 10^{-2}$ | $9.3 \times 10^{-2}$ | $9.0 \times 10^{-2}$ |
| | TiN sheet resistance (Ω/sq.) | 315 | 315.5 | 290 | 278 | 270 |
| Valve 112 adjusted | Pressure in shield-inside space (Pa) when $N_2$ of 50 sccm is introduced to 105 | $8.0 \times 10^{-2}$ | $8.1 \times 10^{-2}$ | $8.0 \times 10^{-2}$ | $8.0 \times 10^{-2}$ | $8.0 \times 10^{-2}$ |
| | TiN sheet resistance (Ω/sq.) | 243 | 245 | 246 | 241 | 243 |

As shown in Table 1, in the case where the whole amount of gas is introduced from the inlet port 114a of the first gas introduction pipe 114 with the variable valve 112 totally closed, a decreasing tendency is found in the pressure in the shield-inside space 108 when an $N_2$ gas of 50 sccm is introduced into the gas supply means 105. Forming a TiN film in this state demonstrated that sheet resistance of TiN decreases as the number of recoveries of the shield board 104 increases. From this result, it is considered that the shield board 104 gradually changed in shape or size of the opening 128 through repeatedly-performed blast processing, and that the amount of the gas 117 leaking to the shield-outside space of the gas introduced from the inlet port 114a of the first gas introduction pipe 114 increased consequently. By contrast to this result, little variation occurred in the sheet resistance of TiN in the case of adjusting the variable valve 112, although recovery of the shield board 104 was repeated.

The pressure measurement by the pressure sensor 111 can be performed by using any of various vacuum gauges such as a nude ion gauge, a capacitance manometer and a pirani gauge, or can be performed by using alternative means capable of detecting how large the pressure in the shield-inside space 108 is. Moreover, the apparatus may be provided with multiple means for detecting pressure. Here, a signal enabling detection of how large the pressure in the shield-inside space 108 is, is called a signal indicating a pressure (also referred to as a pressure signal).

Figure 4:
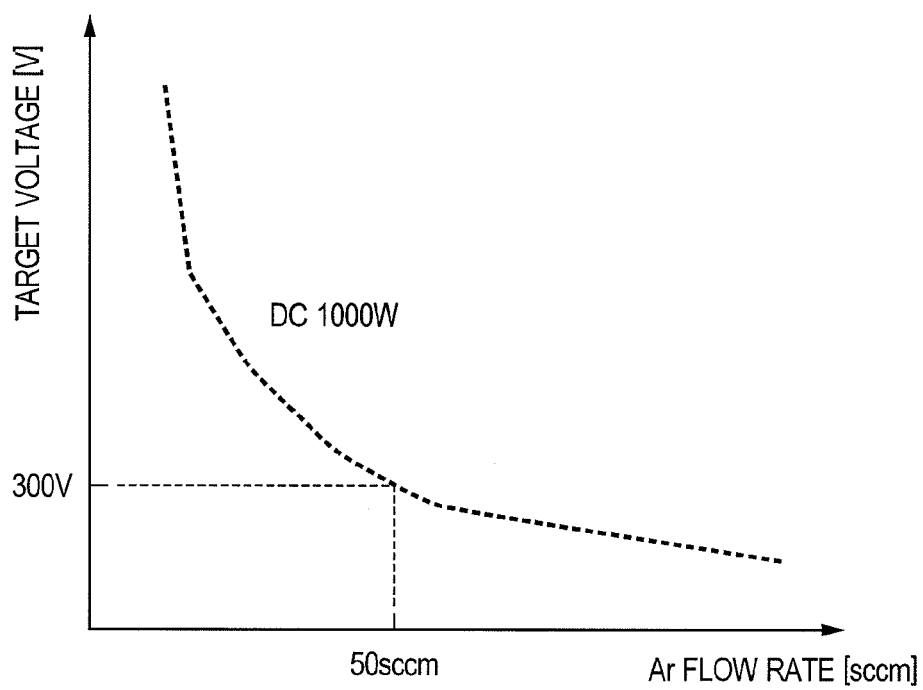
FIG. 4 is a graph showing a relation between the flow rate of an Ar gas and a target voltage in the reactive magnetron sputtering apparatus according to the embodiment of the present invention.
Figure 5:
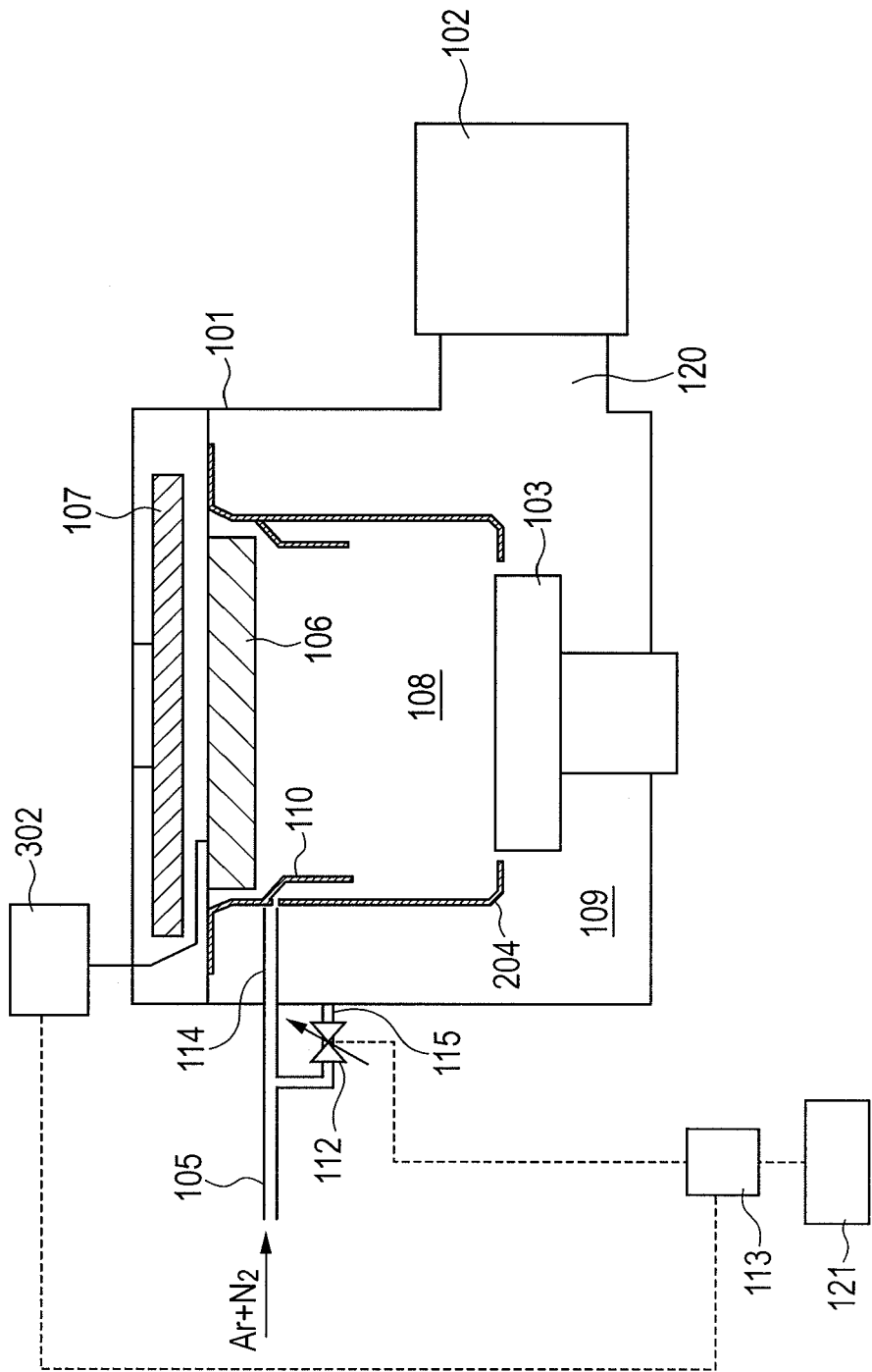
FIG. 5 is a schematic view showing another configuration of the reactive magnetron sputtering apparatus according to the embodiment of the present invention.

For example, FIG. 4 is a graph showing a relation between the flow rate of an Ar gas and a voltage applied to the target when the Ar gas is introduced into the gas supply means 105 and discharge is caused by a fixed power of 1000 W by using a device capable of detecting an electric current or a voltage applied to the target 106 by a DC power supply 302 connected to the target 106 as shown in FIG. 5. FIG. 5 shows a configuration including the DC power supply 302 replacing the pressure sensor 111 in FIG. 1, and the same members as those in FIG. 1 are denoted by the same reference numerals in FIG. 5. As shown in FIG. 4, since the voltage applied to the target 106 has a tendency to decrease monotonously as the flow rate of the Ar gas in the shield-inside space 108 increases, the voltage applied to the target 106 may be used as a signal indicating the pressure in the shield-inside space 108. For example, when an Ar gas of 50 sccm is introduced through the gas supply means 105, the voltage of 300 V applied to the target can be set as a reference value in the case of using the voltage applied to the target as a signal indicating a pressure on the basis of the above characteristics.

Figure 6:
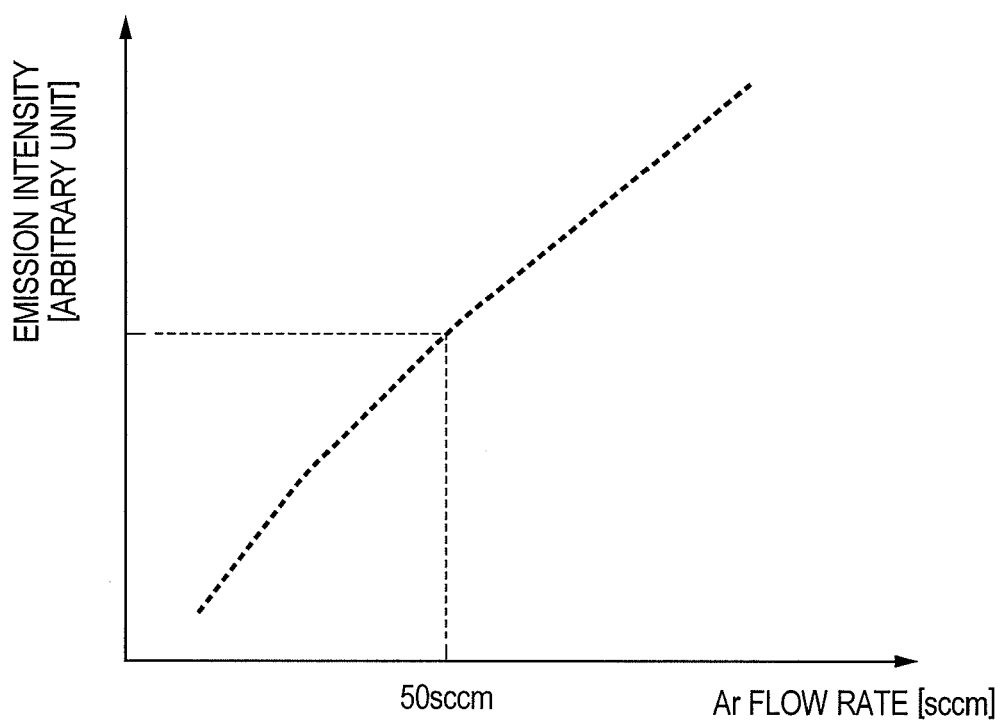
FIG. 6 is a graph showing a relation between the flow rate of the Ar gas and plasma emission intensity in the reactive magnetron sputtering apparatus according to the embodiment of the present invention.
Figure 7:
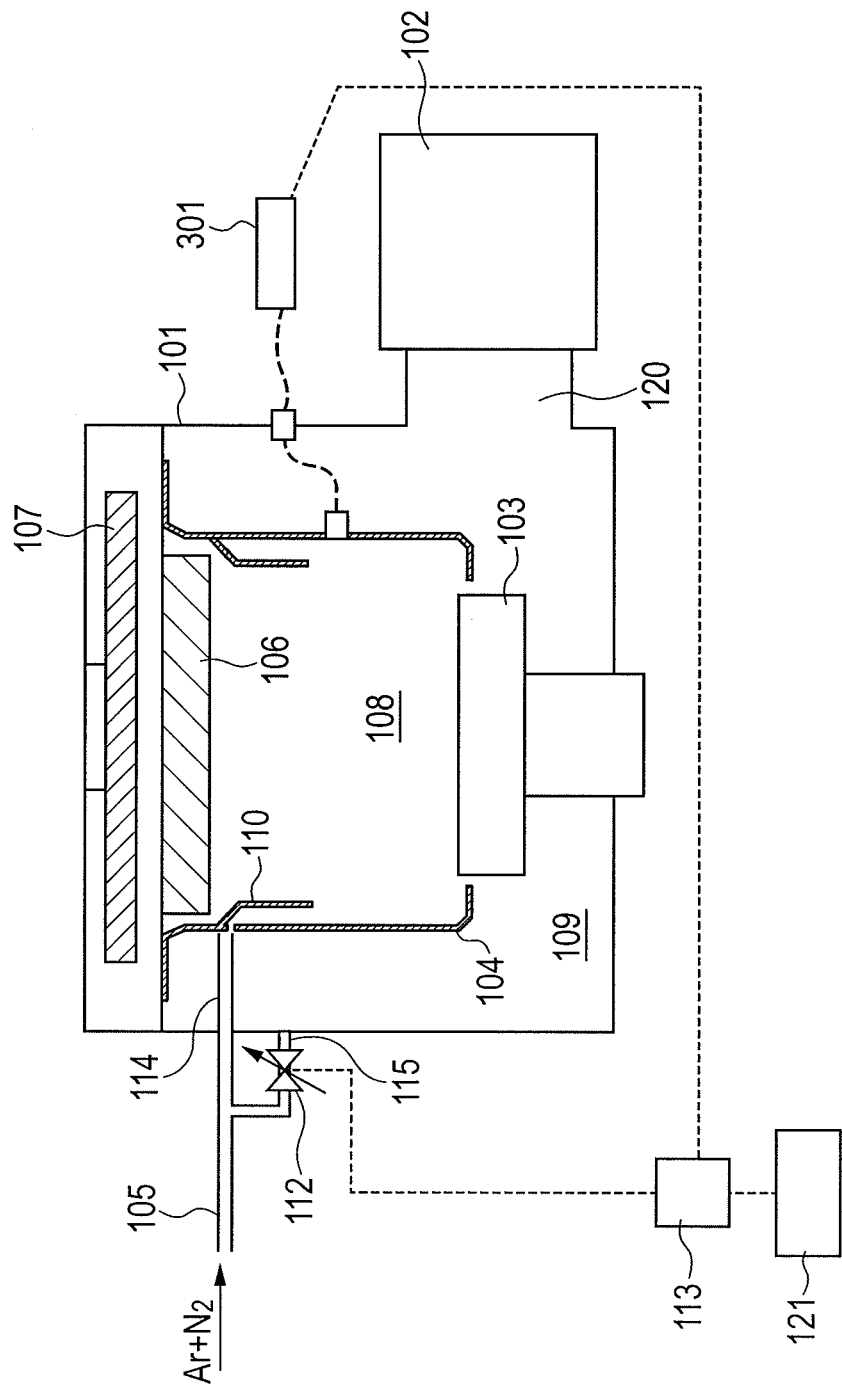
FIG. 7 is a schematic diagram showing another configuration of the reactive magnetron sputtering apparatus according to the embodiment of the present invention.
Figure 8:
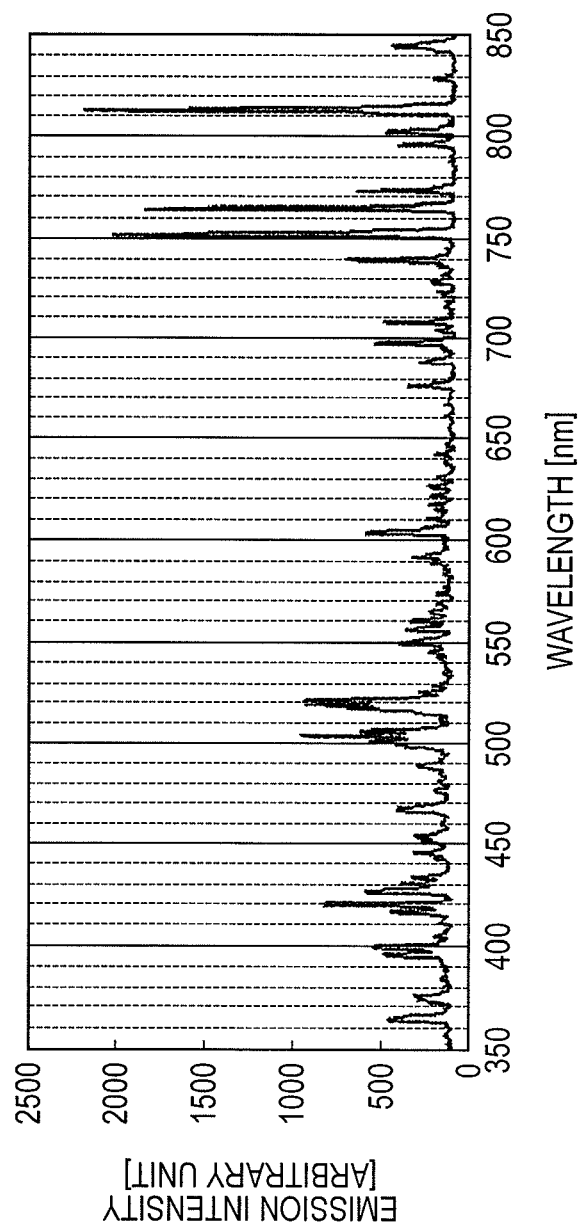
FIG. 8 is a graph showing an emission spectrum detected by a spectroscope in the reactive magnetron sputtering apparatus according to the embodiment of the present invention.

Alternatively, in view of the relation between plasma emission intensity and the flow rate of an Ar gas in the shield-inside space 108 shown in FIG. 6, the plasma emission intensity may be used as a signal indicating a pressure in calibration. The plasma emission intensity can be obtained by detecting an emission spectrum by a known spectroscope 301 connected to the shield-inside space 108 using an apparatus as that shown in FIG. 7. FIG. 7 shows a configuration including the spectroscope 301 replacing the pressure sensor 111 in FIG. 1, and the same members as those in FIG. 1 are denoted by the same reference numerals in FIG. 7. FIG. 8 shows an emission spectrum when an Ar gas of 50 sccm is introduced through the gas supply means 105 and a direct current of 1000 W is applied to the target 106 made of titanium. By plotting a peak intensity of 812 nm representing Ar emission in this emission spectrum, in relation to each flow rate of the Ar gas, the relation shown in FIG. 6 can be obtained.

Figure 9:
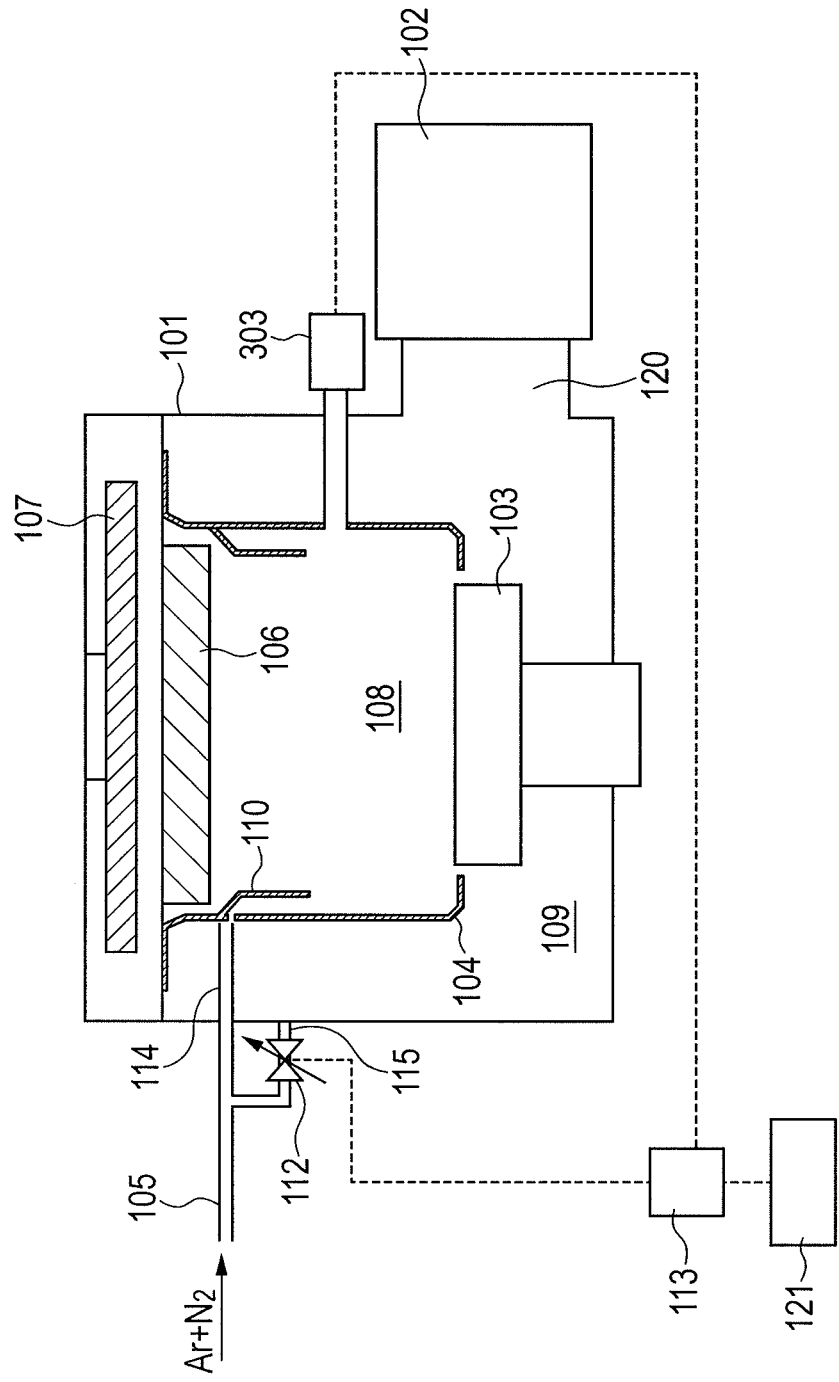
FIG. 9 is a schematic diagram showing another configuration of the reactive magnetron sputtering apparatus according to the embodiment of the present invention.
Figure 10:
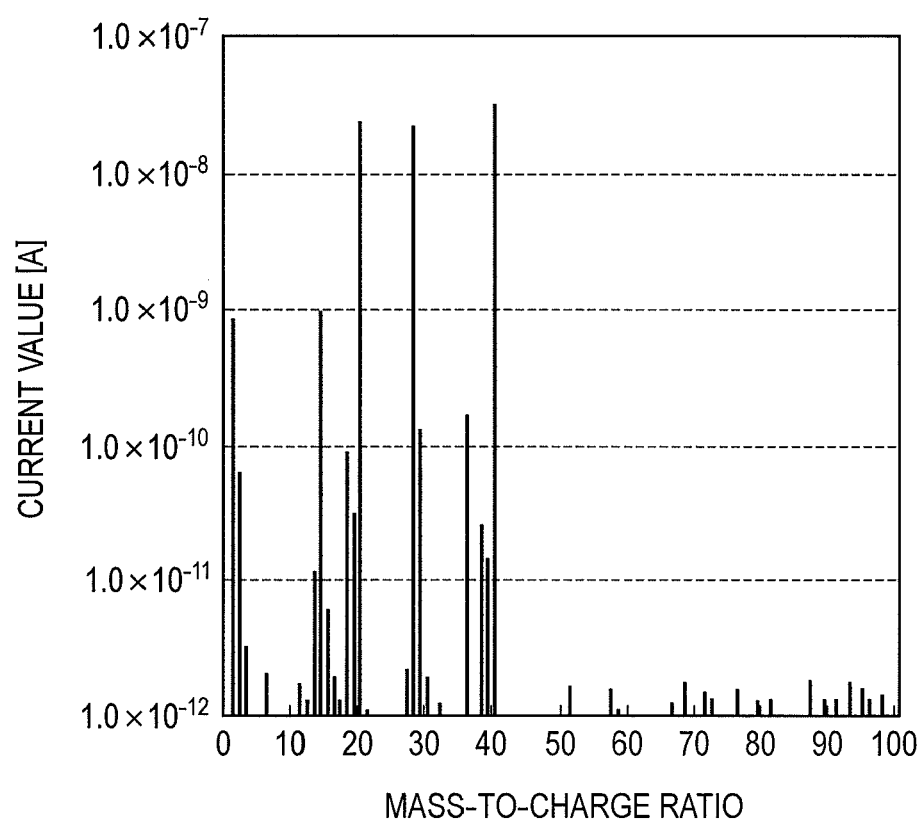
FIG. 10 is a graph showing a relation between a mass-to-charge ratio detected by a mass spectrometer and an electric current value in the reactive magnetron sputtering apparatus according to the embodiment of the present invention.

Alternatively, a known mass spectrometer can be used instead of the pressure sensor 111. For example, in an apparatus as that shown in FIG. 9, when a mass spectrometer 303 is connected to the shield-insides space 108 and an Ar gas of 50 sccm is introduced, data shown in FIG. 10 can be obtained. FIG. 9 shows a configuration including the mass spectrometer 303 replacing the pressure sensor 111 in FIG. 1, and the same members as those in FIG. 1 are denoted by the same reference numerals in FIG. 9. In FIG. 10, the horizontal axis shows a mass-to-charge ratio obtained by dividing the molecular mass of the Ar gas by electric charge (represented as M/Z where M is molecular mass and Z is electric charge), and the vertical axis shows detected intensity (represented as an electric current value). In FIG. 10, the peaks at the mass-to-charge ratios of 36 and 40 correspond to the peak of Ar, and this peak intensity can be used as a signal indicating a pressure in calibration.

As already mentioned, the reference chamber used in Step 31 to acquire a signal value to serve as a reference value in calibration and the adjustment chamber used in Steps 34 and 35 to perform calibration may be different vacuum chambers having the same configuration, and the usage of the target in each vacuum chamber, i.e. an accumulated power applied in each vacuum chamber, may be different. Thus, calibration may be performed by a procedure shown in FIG. 11 in which Steps 31 and 32 in FIG. 3 are performed in the reversed order.

Figure 11:
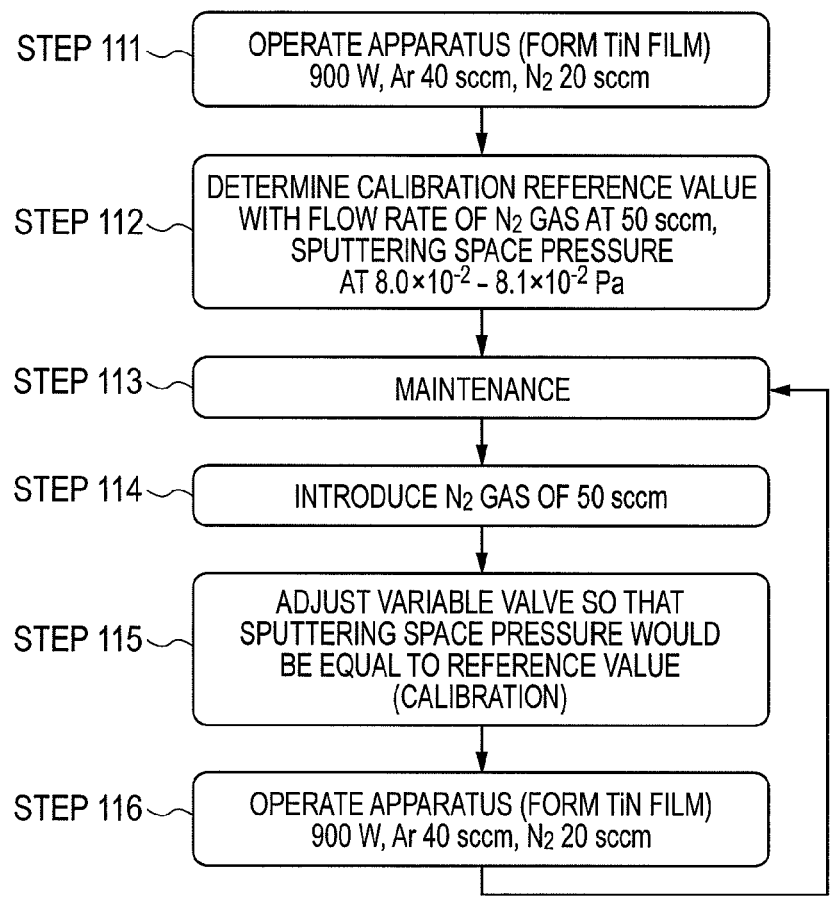
FIG. 11 is a flowchart showing another method of calibrating the reactive magnetron sputtering apparatus according to the embodiment of the present invention.

Although FIG. 3 and FIG. 11 show both a procedure for obtaining a signal value to serve as a reference value in calibration (Steps 31 and 32 in FIG. 3 and Steps 111 and 112 in FIG. 11) and a procedure for performing calibration after a maintenance process (Steps 33 to 35 in FIG. 3 and Steps 113 to 115 in FIG. 11), it is also possible to perform the procedure for performing calibration after a maintenance process (Steps 33 to 35 in FIG. 3 and Steps 113 to 115 in FIG. 11) only while omitting the procedure for obtaining a signal value to serve as a reference value in calibration (Steps 31 and 32 in FIG. 3 and Steps 111 and 112 in FIG. 11).

In other words, it is possible to perform calibration after a maintenance process without obtaining any signal value to serve as a reference value in calibration, if the following steps are performed: the first step of supplying a measurement gas of a predetermined flow rate to the vacuum chamber 101 by the gas supply means 105; the second step of detecting a signal value indicating the pressure in the sputtering space; and the third step of adjusting the ratio of the flow rate of the measurement gas to be introduced into the sputtering space by the first gas introduction means 114 to the flow rate of the measurement gas to be introduced into the sputtering-outside space by the second gas introduction means 115 to correspond to a reference value for calibration for which a signal value is determined in advance.

Here, in a case of using the above-described pressure value or mass spectrometric value as a signal value for calibration, the accumulated power applied to the target does not affect the reference value. However, it is known that, in the case of using a voltage, an electric current or emission intensity, the reference value changes in accordance with the accumulated power applied to the target. For this reason, the reference value for calibration needs to be calculated in consideration of the accumulated power of the target used in performing calibration, if the calibration is performed after target replacement or if the calibration is performed in a vacuum chamber different from that used in determining the calibration reference value.

Figure 12:
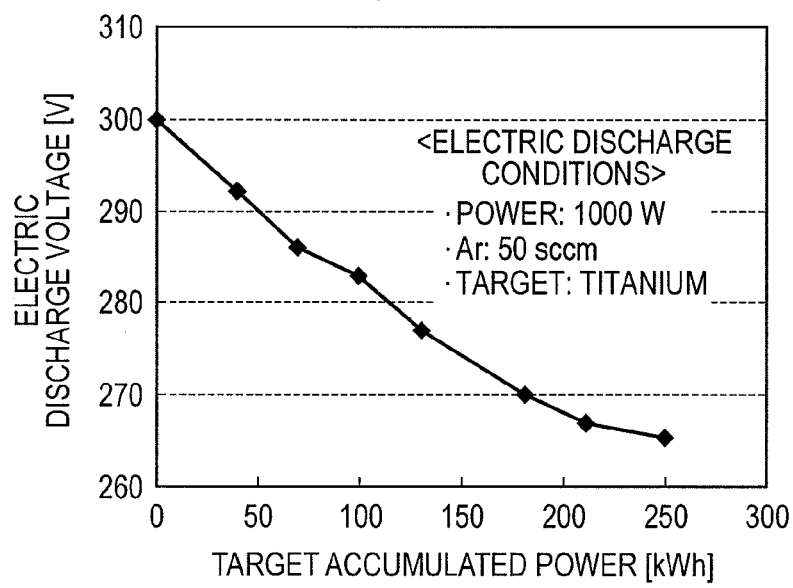
FIG. 12 is a graph showing a relation between an accumulated power consumption of a target and a voltage applied to the target in the reactive magnetron sputtering apparatus according to the embodiment of the present invention.

An example of this is shown in FIG. 12 where a target voltage y is plotted in relation to an accumulated power x when a target made of titanium is placed in the apparatus shown in FIG. 6, an Ar gas of 50 sccm is introduced, and a DC power of 1000 W is applied. With reference to FIG. 12, it is shown that the relation between the target voltage y and the accumulated power x can be expressed by the following relational expression: $y=9\times10^{-7}\times x^3-6\times10^{-6}\times x^2-0.193\times x+300$. By thus obtaining the relation between the target voltage and the accumulated power in advance, a reference value to be used in performing calibration can be calculated from the signal value used to determine the reference value for calibration.

Figure 13:
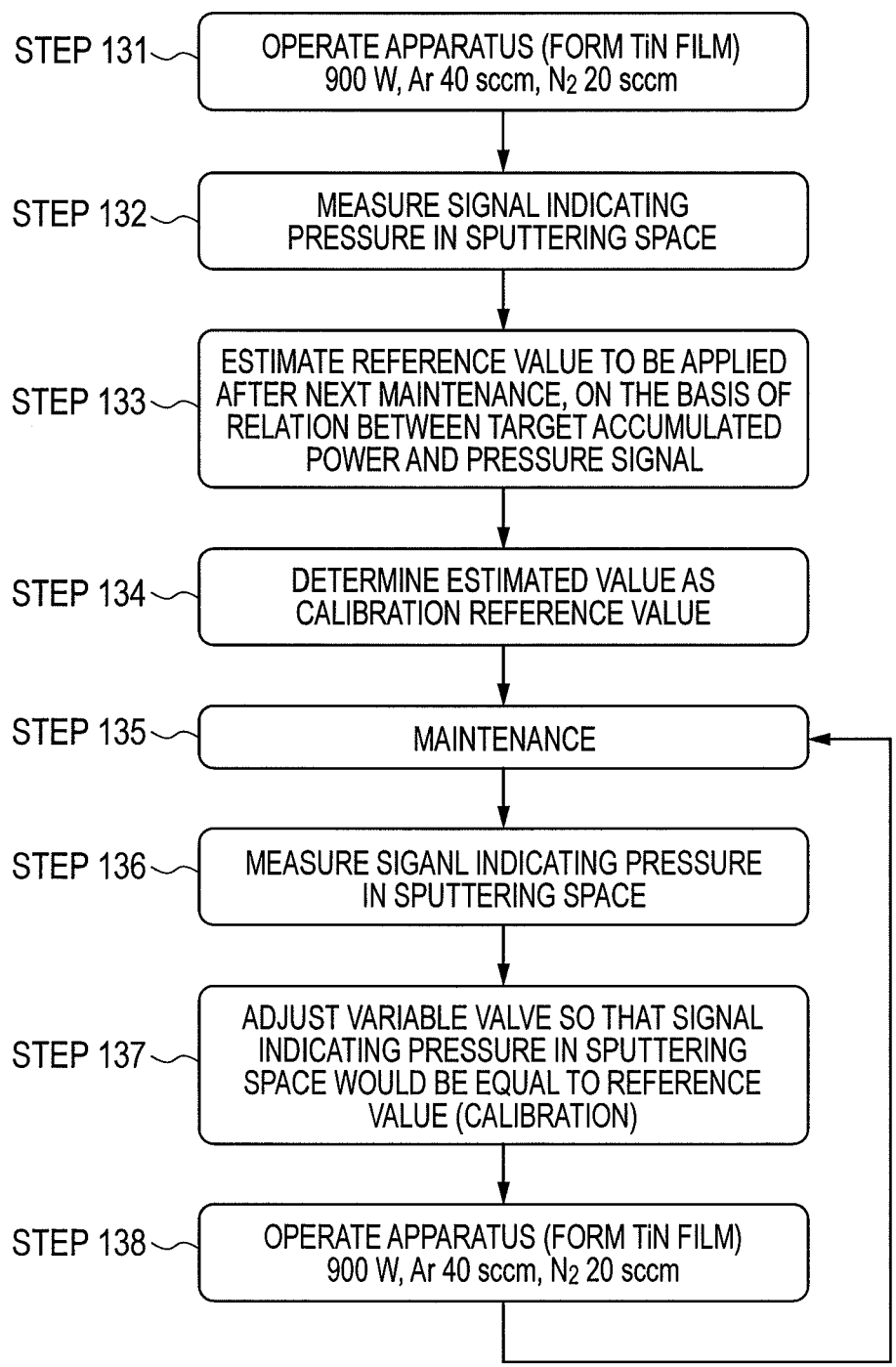
FIG. 13 is a flowchart showing another method of calibrating the reactive magnetron sputtering apparatus according to the embodiment of the present invention.
Figure 14:
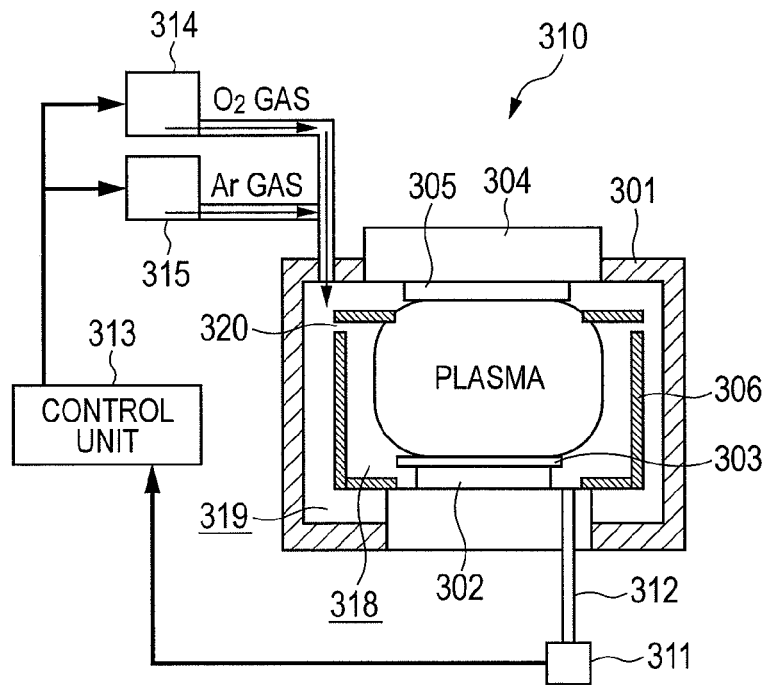
FIG. 14 is a schematic diagram showing a configuration of a conventional reactive sputtering apparatus.
Figure 15:
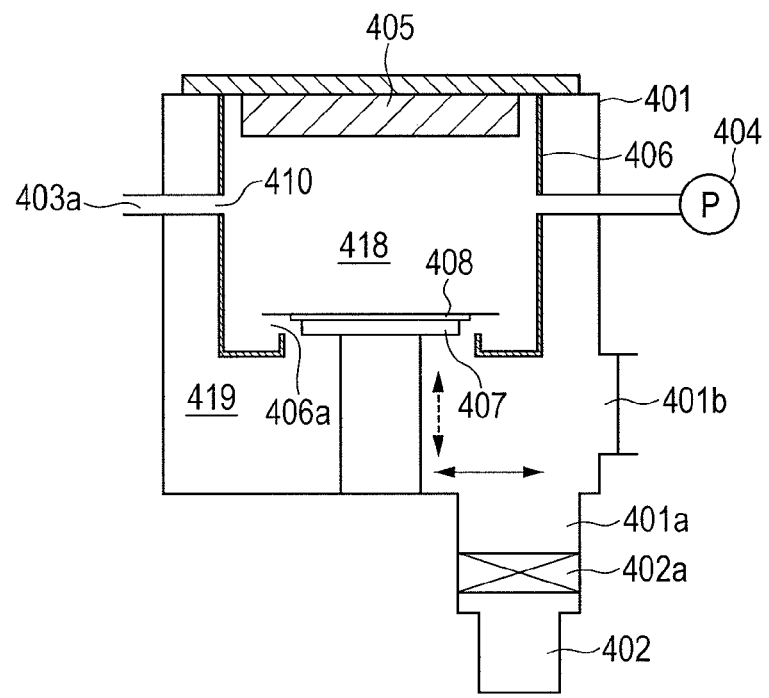
FIG. 15 is a schematic diagram showing a configuration of a conventional reactive sputtering apparatus.

FIG. 13 shows a flowchart of calculating a reference value for calibration on the basis of the relation between a signal indicating a pressure and an accumulated power. Specifically, the value obtained by target voltage measurement in a reference state (Step 133) is 282.5 V when a target accumulated power is 100 kWh. When the target is replaced with a new one in the maintenance in Step 135, the accumulated power in the calibration performed in Steps 136 and 137 is 0 kWh. Accordingly, the reference value for the calibration is to be set at 300 V on the basis of the relation in FIG. 12.

In the apparatus shown in FIG. 1 and FIG. 2, the opening adjustment of the variable valve 112 after the shield board 104 is placed may be performed automatically. Alternatively, it is also possible that the controller 113 performs the opening adjustment of the variable valve 112 and the result is stored as a constant of the adjusted valve opening, in the storage 121 such as an ROM or a HDD. This makes it possible to change the opening of the variable valve 112 as needed, and to read the stored valve opening value and apply the value in performing reactive sputtering again.

For example, the pressure near the target in plasma ignition in electric discharge needs to be kept higher than that at the time of sputtering, in many cases. In such a case, plasma ignition can be caused if the opening of the variable valve 112 is changed before the ignition to allow the whole amount of gas to be supplied to the first gas introduction means. In addition, since the opening of the variable valve 112 can be adjusted to the stored valve opening value after the plasma ignition, reactive sputtering can be performed without performing opening adjustment again.

As described above, the automatically-adjusted valve opening is stored as a constant. Hence, the opening adjustment of the variable valve 112 can be performed with excellent reproducibility without including any individual variations caused by operators. Further, the cost of operating the apparatus for the adjustment can be reduced. In the present description, "valve opening" means the position to which a valve such as a known needle valve, for example, is adjusted in the range between the totally-closed position to the fully-opened position, and can be represented by the number of rotations for an adjustment knob. For example, in the example shown in Table 1, the number of rotations for the adjustment knob is set at "0" in the "valve 112 totally closed" state. For this state, the "constant of valve opening=0" is stored in the storage 121 such as a ROM or a HDD. Meanwhile, the number of rotations for the adjustment knob is set at "2" in the "valve 112 adjusted" state. For this state, the "constant of valve opening=2" is stored in the storage 121 such as a ROM or a HDD. Here, any measures, other than the number of rotations for the adjustment knob, can also be used to specify the "valve opening" as long as being capable of indicating the position to which the valve such as a needle valve is adjusted in the range between the totally-closed position and the fully-opened position. In other words, any measures, other than the number of rotations for the adjustment knob, can also be used as long as being capable of adjusting the conductance.

Further, the opening adjustment of the variable valve 112 by the controller 113 may be performed in consideration of multiple flows or pressure values to thereby use the mean value of the openings corresponding to the multiple flows or pressure values for the adjustment. Specifically, assume that at least a first flow value and a second flow value are provided as predetermined flows. Then, a first valve opening and a second valve opening corresponding respectively to the first flow value and the second flow value are stored in the storage 121 such as a ROM or a HDD. Thereafter, the mean value of the first valve opening and the second valve opening is stored in the storage 121 such as a ROM or a HDD as a constant of the adjusted valve opening. For example, in the above-described embodiment, the adjustment process is performed in each of the cases using an $N_2$ gas flow rate of 5 sccm, 10 sccm, 20 sccm and 50 sccm, and the mean value of the openings of the variable valve 112 obtained using the flow rates is stored in the storage 121 such as a ROM or a HDD, as a constant of the adjusted valve opening. In this way, adjustment with high reliability can be performed while reducing the effect of variations in measured pressure and the like.

The opening adjustment of the variable valve 112 may be performed by an operator. In this case, it is preferable to provide a display which is connected to the pressure sensor 111 and configured to display a pressure value, in the apparatus shown in FIG. 1 and FIG. 2. If the pressure value displayed in the display is different from the calibration reference value, the operator can adjust the opening of the variable valve 112 so that the pressure value displayed in the display would be equal to the calibration reference value.

Although each of the first and second gas introduction pipes 114 and 115 is provided at a position having a larger distance from the turbo-molecular pump 102 than that of the shield-inside space 108, the configuration of the present invention is not limited to this. The positions at which the first and second gas introduction pipes 114 and 115, which are the first and second gas introduction means, are provided can be any as long as being close to each other. Preferable configurations are that: the sputtering space is positioned between the exhaust port and the first and second gas introduction means; and the first and second gas introduction means are positioned between the sputtering space and the exhaust port. If the exhaust port or the sputtering space is positioned between the first gas introduction means and the second gas introduction means, the paths through which the gas passes may change significantly when the ratio of the flows of the gas introduction means is adjusted. If the first and second gas introduction pipes 114 and 115 are positioned closely to each other, however, the gas 117 leaking from the inlet port 114a of the first gas introduction means to the shield-outside space and the inlet port 115a of the second gas introduction means are positioned closely to each other, reducing changes in paths of the gas flows. Hence, such a configuration is suitable for improving reproducibility of the reactive gas pressures both inside and outside the shield-inside space 108.

The valve is used as the gas flow ratio control means for adjusting the distribution ratio of the gas to the first and second gas introduction pipes 114 and 115 from the gas supply means 105, and the conductance is adjusted by changing the opening of the valve. This brings about an effect of performing calibration with excellent reproducibility at a low cost. Alternatively, an orifice or a mass-flow meter, instead of a valve, may be used as the gas flow ratio control means. Further, the gas flow ratio control means only needs to be provided to one of the first and second gas introduction means, although the effect is not lost even if the gas flow ratio control means is provided to both the first and second gas introduction means.

In addition, the sputtering gas and the reactive gas do not always need to be introduced as a mixed gas. The sputtering gas, which has little effect on the film quality, may be introduced into the vacuum chamber 101 independently of the reactive gas. For example, in the above-described embodiment, a third gas introduction pipe may be further included as third gas introduction means. With this configuration, the third gas introduction means may independently introduce a sputtering gas to near the target 106, while the first and second gas introduction means may introduce a reactive gas only. In this case, since the sputtering gas and the reactive gas are introduced separately, the sputtering from the target 106 can be adjusted independently while maintaining the reproducibility of the flow rate of the reactive gas, which is likely to affect the film quality. Accordingly, this configuration has an advantage of facilitating control of the film quality.

The shield board 104 is not limited to the shape shown in FIG. 1 and FIG. 2. Alternatively, the shield-inside space 108 may be formed by combining multiple shield boards, and another opening may be provided which causes the shield-inside space 108 and the shield-outside space 109 to communicate with each other. Further, a known shutter mechanism may be provided between the target 106 and the stage 103. In addition, the present invention brings about effects on changes in size and attachment position of the shield board 104 itself as well as changes in shape caused by recovery of the shield board 104.

The positional relation between the target 106 and the stage 103 is not limited to that shown in FIG. 1 and FIG. 2, either. For example, the target and the stage may be arranged with an angle instead of in parallel, or the target may be disposed on the stage in such a manner that the central axis of the target does not pass the center of the stage. Such a positional relation does not cause any problem. In the present invention, a method such as molecular beam deposition, instead of sputtering using plasma, can be used as physical vapor deposition means. Incidentally, the exhaust means refers to a vacuum pump represented by a turbo-molecular pump, and plays a part in reducing the pressure in the vacuum chamber through the exhaust port.

The stage 103 is for holding the process-target substrate W in the film forming process. The stage 103 may use chuck means such as an electrostatic chucking device, and may further include various functions such as a mechanism for rotating and revolving the substrate, a temperature control mechanism, a biasing mechanism for applying a voltage to the process-target substrate and the like.

Moreover, it is possible to appropriately change the type of the vacuum pump, the shape of the shield board, the number, shape, arrangement, material and surface treatment of the stage, and the like. Although a pipe is used for each of the first and second gas introduction means in the above-described embodiment, the shape may be other than a pipe. Naturally, it is possible to change the shape, the size and the material of the substrate. Although descriptions have been given for TiN film forming by a reactive magnetron sputtering apparatus, in the above-described embodiment, the application of the present invention is obviously not limited to this. The present invention can be applied to any apparatus which includes a shield-inside space defined by a shield board and performs reactive physical vapor deposition. The kind of film to be formed is not limited to TiN, and can obviously be an oxide film, an oxynitride film or the like.

What is claimed is:

1. A film forming apparatus for forming a film on a process-target substrate by sputtering a target containing a film forming material using a sputtering gas and causing at least one kind of reactive gas and the film forming material to react with each other in a vacuum chamber, the film forming apparatus comprising:
   a shield board surrounding a sputtering space between the process-target substrate and the target facing each other in the vacuum chamber;
   a gas supply unit for supplying a mixed gas containing the reactive gas and the sputtering gas to the vacuum chamber in forming the film, the gas supply unit including a first gas introduction unit for introducing the mixed gas into the sputtering space surrounded by the shield board and a second gas introduction unit for introducing the mixed gas into a sputtering outside space between an inner wall of the vacuum chamber and the shield board, the second gas introduction unit branching off from the first gas introduction unit;
   a valve, provided on the second gas introduction unit, for adjusting a flow rate of the mixed gas to be introduced into the sputtering outside space by the second gas introduction unit against a flow rate of the mixed gas to be introduced into the sputtering space by the first gas introduction unit;
   a detection unit for detecting a first signal value indicating a first pressure in the sputtering space before a recovery process for the shield board and a second signal value indicating a second pressure in the sputtering space after the recovery process for the shield board; and
   a controller configured to adjust a valve opening of the valve to make the second signal value equal to the first signal value.

2. The film forming apparatus according to claim 1, wherein each signal value is at least one of a pressure value in the sputtering space, a voltage applied to the target, an electric current flowing into the target, a partial pressure measured by a mass spectrometer, and an emission intensity in sputtering discharge.

3. The film forming apparatus according to claim 1, further comprising:
   a storage configured to store, as a constant, the valve opening adjusted by the controller.

4. The film forming apparatus according to claim 3, wherein at least a first flow value and a second flow value are used as predetermined flow rates, valve openings adjusted using the first flow value and the second flow value are stored in the storage as a first valve opening and a second valve opening, respectively, and the mean value of the first valve opening and the second valve opening is further stored in the storage, as a constant of the adjusted valve opening.

5. The film forming apparatus according to claim 1, further comprising a display connected to the detection unit and configured to display each signal value.

6. The film forming apparatus according to claim 1, wherein the sputtering space is positioned between an exhaust port and the first and second gas introduction units, the exhaust port being a port through which the vacuum chamber is exhausted by an exhaust unit.

7. The film forming apparatus according to claim 1, wherein the first gas introduction unit and the second gas introduction unit are positioned between the sputtering space and an exhaust port through which the vacuum chamber is exhausted by an exhaust unit.

8. The film forming apparatus according to claim 1, comprising a third gas introduction unit for introducing a sputtering gas into the vacuum chamber, independently of the first gas introduction unit and the second gas introduction unit.

9. The film forming apparatus according to claim 1, further comprising a second shield board fixed on the shield board and provided between a gas discharge port of the first gas introduction unit and the target, the second shield board being provided in the sputtering space and one end of the second shield board being attached to the shield board.

10. The film forming apparatus according to claim 1, wherein the film forming apparatus is a physical vapor deposition apparatus.

11. The film forming apparatus according to claim 1, wherein the gas supply unit is capable of supplying a mixture of the reactive gas and a noble gas, or supplying any one of the reactive gas and the noble gas by switchover.

12. The film forming apparatus according to claim 1, wherein the shield board includes an opening portion, and the first gas introduction unit has a pipe shape, and is connected to the opening portion of the shield board.

13. The film forming apparatus according to claim 1, wherein the shield board is detachable from the film forming apparatus.

14. The film forming apparatus according to claim 1, wherein the shield board includes an opening portion, the first gas introduction unit is a first gas introduction pipe inserted into the opening portion, and a clearance is provided between the first gas introduction pipe and the opening portion.

15. The film forming apparatus according to claim 1, wherein a lower end of the shield board is positioned lower than the process-target substrate.

16. The film forming apparatus according to claim 1, wherein the detection unit is a pressure sensor, a DC power supply, a spectroscope, a mass spectrometer, or an accumulated power consumption meter.

17. The film forming apparatus according to claim 1, wherein the first pressure or the second pressure in the sputtering space is a total pressure in the sputtering space.

\* \* \* \* \*